United States Patent
Otsuka

(10) Patent No.: US 10,487,417 B2
(45) Date of Patent: Nov. 26, 2019

(54) METHOD FOR MANUFACTURING A FZ SILICON SINGLE CRYSTAL SUBJECT TO ADDITIONAL GALLIUM DOPING FOR SOLAR CELLS

(71) Applicant: SHIN-ETSU CHEMICAL CO., LTD., Tokyo (JP)

(72) Inventor: Hiroyuki Otsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/538,103

(22) PCT Filed: Nov. 26, 2015

(86) PCT No.: PCT/JP2015/005860
§ 371 (c)(1),
(2) Date: Jun. 20, 2017

(87) PCT Pub. No.: WO2016/110892
PCT Pub. Date: Jul. 14, 2016

(65) Prior Publication Data
US 2017/0350035 A1    Dec. 7, 2017

(30) Foreign Application Priority Data

Jan. 6, 2015   (JP) ................................. 2015-001004

(51) Int. Cl.
*C30B 13/12*     (2006.01)
*C30B 29/06*     (2006.01)
(Continued)

(52) U.S. Cl.
CPC .............. *C30B 13/12* (2013.01); *C30B 15/04* (2013.01); *C30B 29/06* (2013.01); *H01L 31/068* (2013.01); *H01L 31/0288* (2013.01); *Y02E 10/50* (2013.01)

(58) Field of Classification Search
CPC ......... C30B 13/00; C30B 13/08; C30B 13/10; C30B 13/12; C30B 13/16; C30B 13/20;
(Continued)

(56) References Cited

U.S. PATENT DOCUMENTS 3,494,742 A * 2/1970 Lagarde, Jr. ............ C30B 13/20
                                                    117/221
6,815,605 B1   11/2004  Abe et al.
(Continued)

FOREIGN PATENT DOCUMENTS

| CN | 107109692 A | 8/2017 |
| JP | 3679366 B2  | 8/2005 |

(Continued)

OTHER PUBLICATIONS

Dec. 22, 2015 Search Report issued in International Patent Application No. PCT/JP2015/005860.
(Continued)

*Primary Examiner* — Kenneth A Bratland, Jr.
(74) *Attorney, Agent, or Firm* — Oliff PLC

(57) ABSTRACT

The present invention is a method for manufacturing an FZ silicon single crystal for a solar cell, including the steps of: pulling a CZ silicon single crystal doped with gallium by a Czochralski method; and float-zone processing a raw material rod, with the raw material rod being the CZ silicon single crystal, at 1.6 atmospheric pressure or more to manufacture the FZ silicon single crystal. As a result, it is possible to provide a method for manufacturing an FZ silicon single crystal for a solar cell that can decrease the amount of (Continued)

gallium dopant evaporated during the float-zone processing, thereby preventing the silicon single crystal from increasing the resistance while decreasing oxygen, which is inevitably introduced into a CZ crystal, and preventing formation of a B-O pair, which causes a problem to the characteristics of a solar cell.

9 Claims, 4 Drawing Sheets

(51) Int. Cl.
  *H01L 31/068* (2012.01)
  *C30B 15/04* (2006.01)
  *H01L 31/0288* (2006.01)

(58) Field of Classification Search
  CPC ......... C30B 15/00; C30B 15/02; C30B 15/04; C30B 15/20; C30B 29/00; C30B 29/02; C30B 29/06; H01L 31/0288; H01L 31/068
  USPC ... 117/2, 11, 13, 19, 21, 37, 41, 49–51, 928, 117/931, 933
  See application file for complete search history.

(56) References Cited

U.S. PATENT DOCUMENTS

| | | | |
|---|---|---|---|
| 2006/0260538 A1* | 11/2006 | Ye | H01L 21/02381 117/89 |
| 2010/0116194 A1* | 5/2010 | Togawa | C30B 13/285 117/13 |
| 2013/0043442 A1 | 2/2013 | Konno et al. | |
| 2017/0350035 A1 | 12/2017 | Otsuka | |

FOREIGN PATENT DOCUMENTS

| | | | |
|---|---|---|---|
| JP | 2007-314374 | * | 12/2007 |
| JP | 2007-314374 A | | 12/2007 |
| JP | 2008-184374 A | | 8/2008 |
| JP | 2013-058741 A | | 3/2013 |

OTHER PUBLICATIONS

Dec. 1, 2015 Office Action issued in Japanese Patent Application No. 2015-001004.
Jul. 11, 2017 International Preliminary Report issued in International Patent Application No. PCT/JP2015/005860.
Feb. 15, 2019 Office Action Issued in Chinese Patent Application No. 201580072597.3.

* cited by examiner

METHOD FOR MANUFACTURING A FZ SILICON SINGLE CRYSTAL SUBJECT TO ADDITIONAL GALLIUM DOPING FOR SOLAR CELLS

TECHNICAL FIELD

The present invention relates to a method for manufacturing an FZ silicon single crystal for a solar cell and a solar cell fabricated by using such an FZ silicon single crystal.

BACKGROUND ART

Methods for manufacturing a silicon single crystal include a CZ (Czochralski) method, in which high-purity polysilicon is melted in a quartz crucible and is brought into contact with a seed crystal followed by slow growing and pulling; and an FZ (Float Zone) method, in which a single crystal is obtained by heating a part of rod-shaped high-purity polysilicon to form a melting part between the rod-shaped raw material crystal (polysilicon, etc.) and a single crystal positioned below to become a seed crystal, followed by moving the whole body downward while the melting part is supported by surface tension, and cooling the melting part.

Silicon single crystals manufactured by the CZ method is contaminated with oxygen from a quartz crucible. When the concentration thereof is high, many nuclei of oxygen defects are contained. On the other hand, silicon crystals manufactured by the FZ method described above, having low oxygen content, contain few nuclei of oxygen defects.

Patent Document 1 discloses manufacturing an FZ silicon single crystal by an FZ method using a CZ silicon single crystal produced by a CZ method as a raw material rod. Patent Document 1 also discloses that thus manufactured FZ silicon single crystal has low oxygen content too.

It is known that a p-type silicon substrate doped with gallium is used as a silicon substrate for a solar cell in order to prevent decrease in the minority carrier lifetime (e.g., see Patent Document 2).

CITATION LIST

Patent Literature

Patent Document 1: Japanese Unexamined Patent Application publication (Kokai) No. 2007-314374
Patent Document 2: Japanese Patent No. 3679366

SUMMARY OF INVENTION

Problem to be Solved by the Invention

The present inventor has found that a solar cell can achieve high conversion efficiency by preventing the minority carrier lifetime from decreasing due to oxygen defects when the solar cell is fabricated from an FZ silicon single crystal manufactured by an FZ method using a CZ silicon single crystal as a raw material rod, which is different from a solar cell fabricated from a CZ silicon crystal manufactured by a CZ method even when they have been fabricated through the identical process, since an oxygen defect is hard to form in the FZ silicon single crystal due to the low oxygen content. Furthermore, the present inventor has focused on the use of a p-type silicon substrate doped with gallium to improve the minority carrier lifetime, and have attempted to manufacture a silicon single crystal for a solar cell by the FZ method using a CZ silicon single crystal doped with gallium as a raw material rod.

In an attempt to manufacture an FZ silicon single crystal doped with gallium by an FZ method using a CZ silicon single crystal doped with gallium as a raw material rod, however, gallium dopant evaporates during melting of the float-zone of the raw material rod to obtain an FZ silicon single crystal doped with gallium having very high resistivity. When a solar cell is fabricated by using such a silicon single crystal, the internal resistance becomes excessively high to cause decrease of the conversion efficiency.

The present invention was accomplished in view of the above-described problems. It is an object of the present invention to provide a method for manufacturing an FZ silicon single crystal for a solar cell that can decrease the amount of gallium dopant evaporated during the float-zone processing, thereby preventing the FZ silicon single crystal from increasing the resistance while decreasing oxygen, which is inevitably introduced into a CZ crystal, and preventing formation of a B-O pair, which causes a problem to the characteristics of a solar cell.

Means for Solving Problem

To achieve the above-described objects, the present invention provides a method for manufacturing an FZ silicon single crystal for a solar cell, comprising the steps of:
pulling a CZ silicon single crystal doped with gallium by a Czochralski method; and
float-zone processing a raw material rod, with the raw material rod being the CZ silicon single crystal, at 1.6 atmospheric pressure or more to manufacture the FZ silicon single crystal.

By subjecting the raw material rod to float-zone processing at 1.6 atmospheric pressure or more to manufacture the FZ silicon single crystal as described above, it is possible to decrease the amount of gallium dopant evaporated during the float-zone processing. Thereby, it is possible to prevent the FZ silicon single crystal from increasing the resistance. Since the CZ silicon single crystal is subjected to float-zone processing, oxygen, which is inevitably introduced into the CZ crystal, can be decreased by out-diffusion. Since the substrate is doped with gallium, boron is not used as the dopant. Accordingly, the substrate can be prevented from forming a B-O pair, which causes a problem to the characteristics of a solar cell. Therefore, the conversion efficiency of a solar cell can be improved by fabricating the solar cell using a silicon substrate produced from thus manufactured FZ silicon single crystal for a solar cell.

It is preferable that the FZ silicon single crystal is subjected to additional gallium-doping by using dopant gas in the float-zone processing.

The gallium evaporated during the float-zone processing can be supplied by additionally doping the FZ silicon single crystal with gallium by using dopant gas in the float-zone processing as described above. This makes it possible to efficiently prevent the FZ silicon single crystal from increasing the resistance.

It is preferable that the additional gallium-doping be performed with a flow rate and/or a concentration of the dopant gas being changed in an axial direction in accordance with an axial distribution of a gallium concentration of the CZ silicon single crystal to equalize an axial distribution of a gallium concentration of the FZ silicon single crystal.

The variation of resistivity can be decreased in the axial direction of the FZ silicon single crystal by equalizing the axial distribution of the gallium concentration of the FZ silicon single crystal as described above, which makes it possible to improve the yield of thus manufactured FZ silicon single crystal (the ratio of the area, the resistivity of which meets the standard).

As the dopant gas, any of an organic gallium compound, a halogenated gallium compound, and a gallium hydride can be used.

The foregoing gases can be suitably used as the dopant gas for additional gallium-doping.

The float-zone processing is preferably performed in an atmosphere containing argon or helium.

The FZ silicon single crystal can be prevented from introducing impurities by performing the float-zone processing in the atmosphere described above.

It is preferable that the FZ silicon single crystal is manufactured to have a diameter of 150 mm or more.

When the FZ silicon single crystal to be manufactured is in a diameter of 150 mm or more, dopant vaporizes easily, therefore, the present invention can be applied suitably.

In order to achieve the foregoing object, the present invention provides a solar cell, wherein the solar cell is fabricated by using the FZ silicon single crystal manufactured by the foregoing method for manufacturing an FZ silicon single crystal for a solar cell.

Such a solar cell can improve the conversion efficiency, with the silicon single crystal substrate used as a substrate being prevented from increasing the resistance thereof.

Effect of Invention

As described above, the inventive method for manufacturing an FZ silicon single crystal for a solar cell can decrease the amount of gallium dopant evaporated during the float-zone processing by manufacturing the FZ silicon single crystal by the float-zone processing of a raw material rod at 1.6 atmospheric pressure or more. This can also prevent the FZ silicon single crystal from increasing the resistance thereof. When a solar cell is fabricated by using a silicon substrate produced from thus formed FZ silicon single crystal for a solar cell, it is possible to improve the conversion efficiency of the fabricated solar cell. The inventive solar cell can prevent the silicon single crystal substrate used as the substrate from increasing the resistance, thereby improving the conversion efficiency of the solar cell.

DESCRIPTION OF EMBODIMENTS

Hereinafter, the present invention will be specifically described by reference to FIGS as an example of the embodiment, but the present invention is not limited thereto.

As described above, the present inventor has attempted to manufacture a silicon single crystal for a solar cell by an FZ method using a CZ silicon single crystal doped with gallium as a raw material rod in order to prevent decrease in the minority carrier lifetime of a substrate. However, gallium dopant evaporates during melting of the float-zone of the raw material rod to obtain an FZ silicon single crystal doped with gallium having very high resistivity. When a solar cell is fabricated by using such a silicon single crystal, there was a problem that the internal resistance becomes excessively high to cause decrease of the conversion efficiency.

Accordingly, the present inventor has diligently investigated a method for manufacturing an FZ silicon single crystal for a solar cell that can decrease the amount of gallium dopant evaporated during the float-zone processing, thereby preventing the FZ silicon single crystal from increasing the resistance thereof. As a result, the present inventor has found that the amount of gallium dopant evaporated during the float-zone processing can be decreased by manufacturing the FZ silicon single crystal by the float-zone processing of a raw material rod at 1.6 atmospheric pressure or more, thereby making it possible to prevent the FZ silicon single crystal from increasing the resistance thereof; thereby bringing the present inventive to completion.

Figure 3:
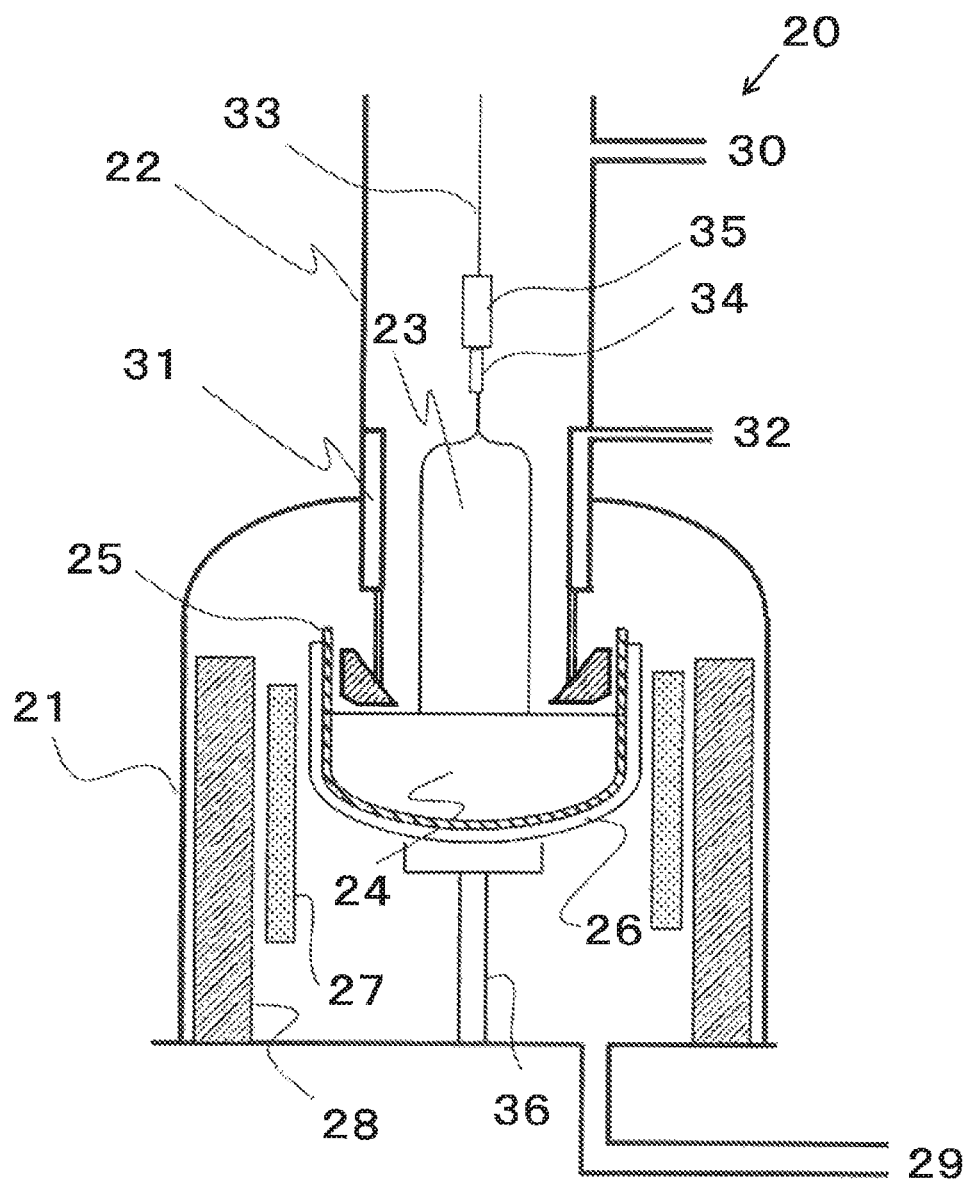
FIG. 3 is a schematic diagram showing an example of an apparatus for manufacturing a CZ silicon single crystal which is used for the inventive method of manufacturing an FZ silicon single crystal for a solar cell.
Figure 4:
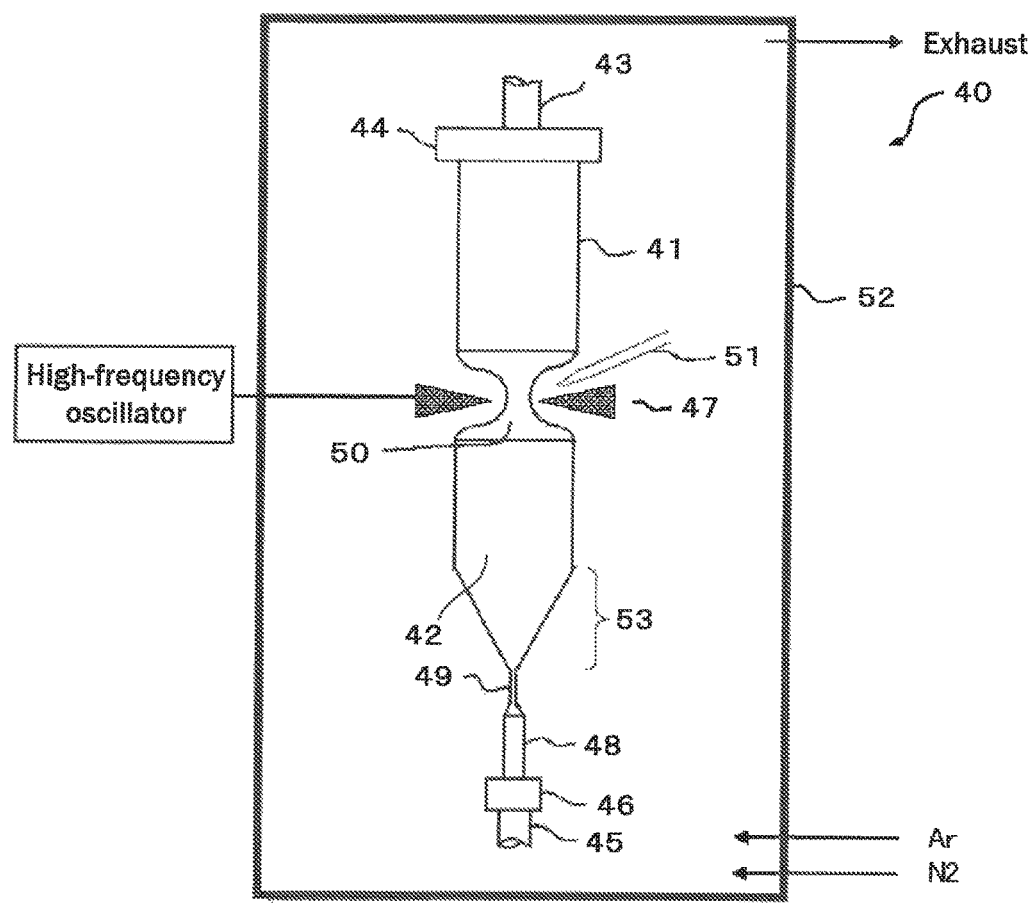
FIG. 4 is a schematic diagram showing an example of an apparatus for manufacturing a FZ silicon single crystal which is used for the inventive method of manufacturing an FZ silicon single crystal for a solar cell.

Hereinafter, the inventive method for manufacturing an FZ silicon single crystal for a solar cell will be described by reference to FIGS. 1 and 3 to 4.

Figure 1:
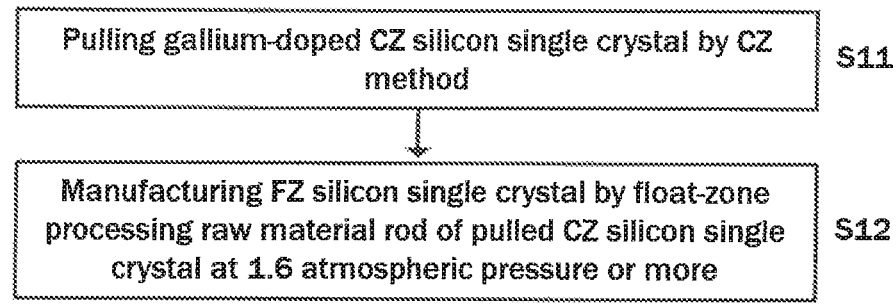
FIG. 1 is a flow diagram showing the inventive method for manufacturing an FZ silicon single crystal for a solar cell.

First, a CZ silicon single crystal doped with gallium is pulled by a CZ method (see Step S11 in FIG. 1). Various methods can be used as the CZ method. Specifically, the gallium-doped CZ silicon single crystal (single crystal rod) 23 is pulled by using the CZ single-crystal manufacturing apparatus 20 of FIG. 3, for example. In FIG. 3, the CZ single-crystal manufacturing apparatus 20 has the main chamber 21 in which the heater 27 and the quartz crucible 25 for containing the raw material melt 24 are disposed, the pulling chamber 22 provided on the main chamber 21, and the cooling cylinder 31 disposed immediately above the raw material melt 24 and extending downward from the ceiling of the main chamber 21 to cool the pulled single crystal rod 23. The main chamber 21 may be provided with the gas outlet 29 at the bottom, and the pulling chamber 22 may be provided with the gas inlet 30 at the upper part thereof. The quartz crucible 25 is supported by the graphite crucible 26, for example, and the graphite crucible 26 is supported by the crucible rotating shaft 36, for example. On the outside of the heater 27 to heat the quartz crucible 25, the heat insulator 28 is provided so as to surround the circumference, for example. The pulling chamber 22 is provided with a pulling mechanism (not shown in the figure) at the upper part thereof, for example. From the pulling mechanism, the pulling wire 33 is reeled out, with the tip of the pulling wire 33 being connected to the seed holder 35 for fixing the seed crystal 34, for example. The cooling cylinder 31 is provided with the coolant inlet 32, for example. In Step S11, a single crystal to be grown can be doped with gallium by introducing a prescribed amount of gallium into the quartz crucible 25, for example.

Subsequently, an FZ silicon single crystal is manufactured by float-zone processing a raw material rod at 1.6 atmospheric pressure or more, using the CZ silicon single crystal produced in Step S11 as the raw material rod (see Step S12 in FIG. 1). Specifically, by using the FZ single-crystal manufacturing apparatus 40 of FIG. 4, for example, a gallium-doped CZ silicon single crystal produced by a CZ method is fixed to the upper holding jig 44 of the upper axis 43, which is installed in the chamber 52 of the FZ single-crystal manufacturing apparatus 40, with a screw and so on to make the raw material rod 41. The seed crystal 48 having a small diameter is fixed to the lower holding jig 46 of the lower axis 45. Then, the lower end of the cone portion 53 of the raw material rod 41 (in FIG. 4, showing a situation in which the float-zone processing have proceeded to a certain extent, the cone portion 53 is shown as the cone portion of the FZ single crystal rod 42) is pre-heated with a carbon ring (not shown in the figure). Subsequently, Ar gas containing nitrogen gas is supplied from the lower part of the chamber 52 while exhausting from the upper part of the chamber 52 to make the chamber 52 have pressure of 1.6 atmospheric pressure or more. For example, the flow rate of the Ar gas may be 20 l/min, and the nitrogen concentration in the chamber may be 0.5%. The raw material rod 41 is heated to melt with the induction heating coil (high-frequency coil) 47, with the tip of the cone portion 53 welded to the seed crystal 48, to eliminate dislocations through the necking portion 49 afterward. The raw material rod 41 is moved down at a growth rate of 2.0 mm/min, for example, while rotating the upper axis 43 and the lower axis 45 to move the float-zone 50 to the upper end of the raw material rod 41, thereby being subjected to zoning, and the raw material rod 41 is recrystallized to grow the single crystal rod 42.

In the float-zone processing of Step S12, the FZ silicon single crystal is preferably subjected to additional gallium-doping by spraying dopant gas from the dopant-gas spraying nozzle 51 to float-zone 50. By the additional gallium-doping of the FZ silicon single crystal using a dopant gas in the float-zone processing as described above, gallium, which is evaporated during the float-zone processing, can be supplied to efficiently prevent the FZ silicon single crystal from increasing the resistance.

In the additional gallium-doping, the axial distribution of the gallium concentration of the FZ silicon single crystal is preferably equalized by changing the flow rate and/or the concentration of the dopant gas in the axial direction in accordance with the axial distribution of the gallium concentration of the CZ silicon single crystal. With the uniform axial distribution of the gallium concentration of the FZ silicon single crystal described above, the FZ silicon single crystal can decrease the variation of resistivity in the axial direction, which can improve the yield of thus manufactured FZ silicon single crystal (the ratio of the area, the resistivity of which meets the standard).

At this stage, any of an organic gallium compound, a halogenated gallium compound, and a gallium hydride can be used as the dopant gas. The foregoing gases can be suitably used as the dopant gas for additional gallium-doping.

At this stage, the float-zone processing is preferably performed in an atmosphere containing argon or helium. The FZ silicon single crystal can be prevented from introducing impurities by performing the float-zone processing in the atmosphere described above.

It is preferable that the diameter of the FZ silicon single crystal to be manufactured is 150 mm or more. When manufacturing an FZ silicon single crystal for a solar cell having the diameter of 150 mm or more, the float-zone becomes large, and gallium easily vaporizes, therefore, the present invention can be applied suitably.

In the method for manufacturing an FZ silicon single crystal for a solar cell described above, the raw material rod 41 is subjected to float-zone processing at 1.6 atmospheric pressure or more to manufacture the FZ silicon single crystal, which makes it possible to decrease the amount of gallium dopant evaporated during the float-zone processing to prevent the FZ silicon single crystal from increasing the resistance. Since the CZ silicon single crystal is subjected to float-zone processing, oxygen, which is inevitably introduced into the CZ crystal, can be decreased by out-diffusion. Since the substrate is doped with gallium, and boron is not used as the dopant. Accordingly, the substrate can be prevented from forming a B-O pair, which causes a problem to the characteristics of a solar cell. The inventive method can achieve these at the same time. Therefore, the conversion efficiency of a solar cell can be improved by fabricating the solar cell using a silicon substrate produced from thus manufactured FZ silicon single crystal for a solar cell.

Subsequently, the inventive solar cell will be described by reference to FIG. 2.

Figure 2:
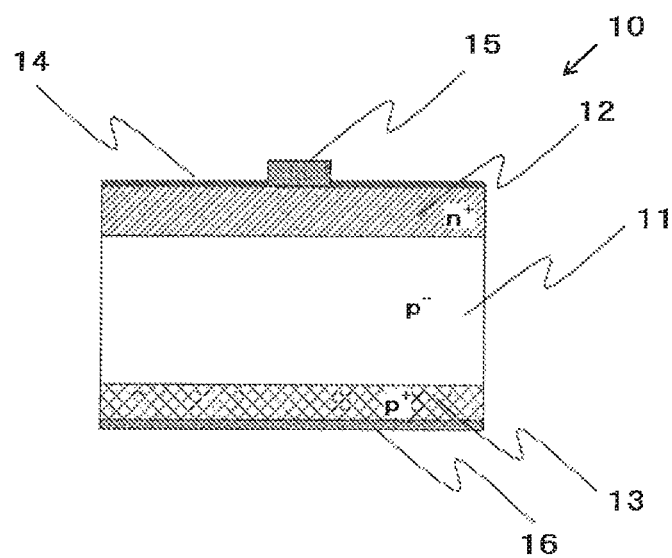
FIG. 2 is a sectional view showing an example of the embodiment of the inventive solar cell.

The solar cell 10 of FIG. 2 is fabricated by using the FZ silicon single crystal manufactured by the method for manufacturing an FZ silicon single crystal for a solar cell described above. The solar cell 10 has the gallium-doped silicon substrate 11 sliced from an FZ silicon single crystal, the emitter layer (phosphorus diffusion layer) 12 provided on the light-receiving surface side of the gallium-doped silicon substrate 11, and the BSF layer (aluminum diffusion layer) 13 provided on the back surface side of the gallium-doped silicon substrate 11. The emitter layer 12 is provided with the light-receiving surface antireflection coating 14 on the light-receiving surface. The solar cell 10 additionally has the light-receiving surface electrode 15 provided on the light-receiving surface of the emitter layer 12, and the back surface aluminum electrode 16 provided on the back surface of the BSF layer 13. It is to be noted that in the solar cell 10, the light-receiving surface electrode 15 is electrically connected with the emitter layer 12, by passing through the light-receiving surface antireflection coating 14; and the back surface aluminum electrode 16 is electrically connected with the BSF layer 13.

In such a solar cell, the conversion efficiency can be improved since the solar cell is fabricated by using an FZ silicon single crystal containing decreased amount of oxygen, which is inevitably introduced into a CZ crystal; prevented from forming a B-O pair, which causes a problem to the characteristics of a solar cell; and prevented from increasing the resistance.

Subsequently, an example of a method for manufacturing the solar cell 10 of FIG. 2 will be specifically described by reference to FIG. 5.

Figure 5:
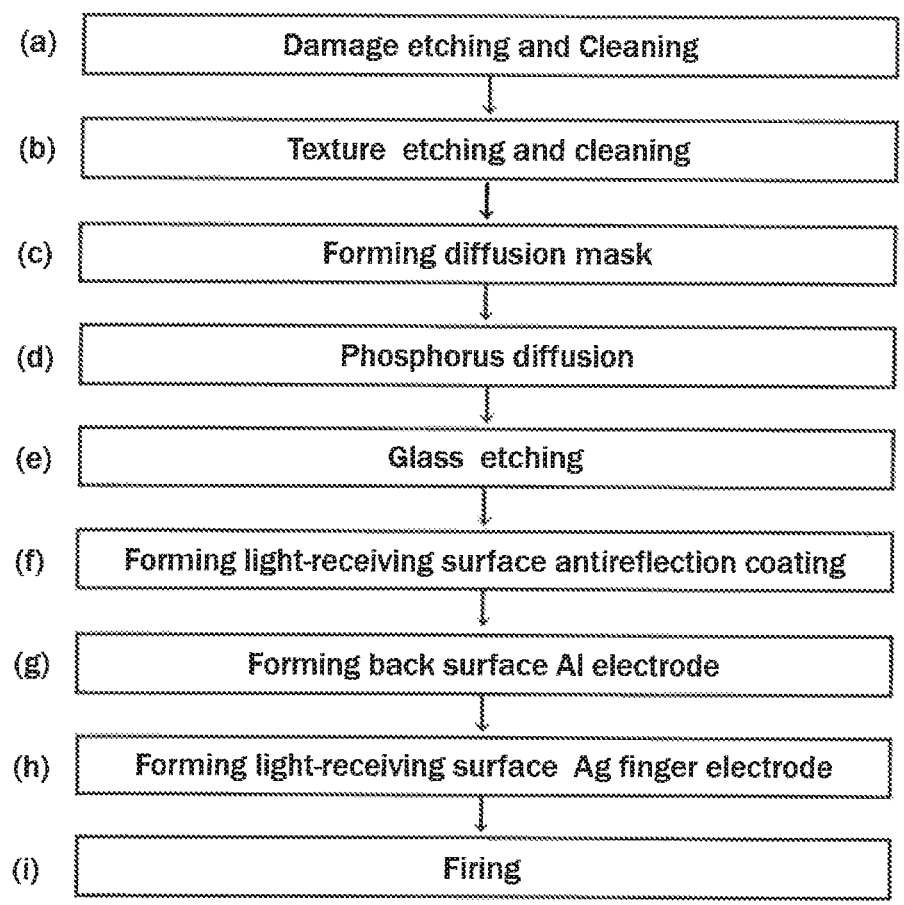
FIG. 5 is a diagram showing an example of a production flow to manufacture the inventive solar cell.

First, the gallium-doped silicon substrate 11 sliced from a silicon single crystal ingot is cleaned after removing the damaged layer (see FIG. 5 (a)). The removal of the damaged layer can be performed by dipping the gallium-doped silicon substrate 11 into hot concentrated potassium hydroxide aqueous solution, for example.

Then, the gallium-doped silicon substrate 11, in which the damaged layer is removed, is subjected to texture etching followed by cleaning (see FIG. 5 (b)). The texture etching can be performed by dipping into aqueous solution of potassium hydroxide/2-propanol, for example. It is to be noted that the texture etching makes it possible to form fine roughness, which is called as texture, to reduce the reflectance of the light-receiving surface.

Subsequently, on the gallium-doped silicon substrate 11 subjected to the texture etching, a diffusion mask for forming the emitter layer (phosphorus diffusion layer) 12 is formed (see FIG. 5 (c)). The formation of diffusion mask can be performed by putting the gallium-doped silicon substrate 11 into a horizontal furnace, and growing oxide films by thermal oxidation, followed by etching one side thereof.

Next, the gallium-doped silicon substrate 11 having the diffusion mask formed thereon is subjected to phosphorus diffusion (see FIG. 5 (d)). The phosphorus diffusion can be performed by putting the gallium-doped silicon substrate 11 into a horizontal furnace, followed by thermal treatment in an atmosphere of oxygen and $POCl_3$ gas, for example. It is also possible to reduce the production cost by inserting two pieces of the gallium-doped silicon substrates 11, without forming diffusion masks described above, to one grove of a quartz boat such that the $POCl_3$ gas does not reach to the one side of each pieces in the diffusion, followed by forming a phosphorus diffusion layer onto another side of each pieces, for example.

Then, the gallium-doped silicon substrate 11 is treated with hydrofluoric acid to remove phosphorus glass and a silicon oxide film formed on the surface thereof (see FIG. 5 (e)).

Subsequently, the light-receiving surface antireflection coating 14 is formed on the light-receiving surface of the emitter layer 12 of the gallium-doped silicon substrate 11 (see FIG. 5 (f)). The formation of the light-receiving surface antireflection coating 14 can be performed by forming a silicon nitride film by plasma CVD, for example.

Then, the back surface aluminum electrode 16 is formed on the back surface of the gallium-doped silicon substrate 11 (see FIG. 5 (g)). The back surface aluminum electrode 16 can be formed by screen printing of Al paste onto the back surface of the gallium-doped silicon substrate 11 except for the bus bar electrode portion, for example. After that, a silver electrode (not shown in the figure) is formed onto the bus bar electrode portion on the back surface of the gallium-doped silicon substrate 11 by screen printing using silver paste.

Next, the light-receiving surface electrode 15 is formed on the light-receiving surface of the light-receiving surface antireflection coating 14 (see FIG. 5 (h)). The formation of the light-receiving surface electrode 15 can be performed by screen printing in a desired pattern by using silver paste, for example.

Subsequently, firing is performed on the gallium-doped silicon substrate 11 on which the back surface aluminum electrode 16 and the light-receiving surface electrode 15 are formed (see FIG. 5 (i)). During this firing, aluminum diffuses from the back surface aluminum electrode 16 to the gallium-doped silicon substrate 11 to form the BSF layer (aluminum diffusion layer) 13. It is to be noted that the light-receiving surface electrode 15 and the emitter layer 12 can be electrically connected, by passing the light-receiving surface electrode 15 through the light-receiving surface antireflection coating 14 during the firing without forming opening in the light-receiving surface antireflection coating 14.

In the foregoing way, the solar cell 10 of FIG. 2 can be fabricated.

EXAMPLES

Hereinafter, the present invention will be more specifically described by showing Examples and Comparative Examples, but the present invention is not limited thereto.

Example 1

An FZ silicon single crystal was manufactured by the manufacturing method described by using FIG. 1. Provided that the float-zone processing was performed at the pressure of 1.6 atmospheric pressure without performing additional gallium-doping by using dopant gas in the float-zone processing. By using a gallium-doped silicon substrate sliced from the manufactured FZ silicon single crystal, the solar cell 10 of FIG. 2 was fabricated by the manufacturing method described by using FIG. 5.

The battery characteristics (short-circuit current density, open circuit voltage, fill factor, and conversion efficiency) were measured on the fabricated solar cell. The results are shown in Table 1. Herein, the short-circuit current density is a value of current density when the resistor connected to the solar cell shows resistance of 0 Ω; the open circuit voltage is a voltage value when the resistor connected to the solar cell shows very large resistance; the fill factor (form factor) is the maximum generated electric power/(short-circuit current×open circuit voltage); and the conversion efficiency is (output from the solar cell/solar energy input to the solar cell)×100.

Example 2

An FZ silicon single crystal was manufactured in the same way as in Example 1. Provided that the pressure in the float-zone processing was set to 1.8 atmospheric pressure. By using a gallium-doped silicon substrate sliced from the manufactured FZ silicon single crystal, the solar cell 10 of FIG. 2 was fabricated by the manufacturing method described by using FIG. 5.

The battery characteristics (short-circuit current density, open circuit voltage, fill factor, and conversion efficiency) were measured on the fabricated solar cell. The results are shown in Table 1.

Example 3

An FZ silicon single crystal was manufactured in the same way as in Example 1. Provided that the pressure in the float-zone processing was set to 2.0 atmospheric pressure. By using a gallium-doped silicon substrate sliced from the manufactured FZ silicon single crystal, the solar cell 10 of FIG. 2 was fabricated by the manufacturing method described by using FIG. 5.

The battery characteristics (short-circuit current density, open circuit voltage, fill factor, and conversion efficiency) were measured on the fabricated solar cell. The results are shown in Table 1.

Example 4

An FZ silicon single crystal was manufactured in the same way as in Example 1. Provided that additional gallium-doping was performed by using dopant gas in the float-zone processing. By using a gallium-doped silicon substrate sliced from the manufactured FZ silicon single crystal, the solar cell 10 of FIG. 2 was fabricated by the manufacturing method described by using FIG. 5.

The battery characteristics (short-circuit current density, open circuit voltage, fill factor, and conversion efficiency) were measured on the fabricated solar cell. The results are shown in Table 1.

Comparative Example 1

An FZ silicon single crystal was manufactured in the same way as in Example 1. Provided that the pressure in the float-zone processing was set to 1.2 atmospheric pressure. By using a gallium-doped silicon substrate sliced from the manufactured FZ silicon single crystal, the solar cell 10 of FIG. 2 was fabricated by the manufacturing method described by using FIG. 5.

The battery characteristics (short-circuit current density, open circuit voltage, fill factor, and conversion efficiency) were measured on the fabricated solar cell. The results are shown in Table 1.

Comparative Example 2

An FZ silicon single crystal was manufactured in the same way as in Example 1. Provided that the pressure in the float-zone processing was set to 1.4 atmospheric pressure. By using a gallium-doped silicon substrate sliced from the manufactured FZ silicon single crystal, the solar cell 10 of FIG. 2 was fabricated by the manufacturing method described by using FIG. 5.

The battery characteristics (short-circuit current density, open circuit voltage, fill factor, and conversion efficiency) were measured on the fabricated solar cell. The results are shown in Table 1.

Comparative Example 3

An FZ silicon single crystal was manufactured in the same way as in Example 1. Provided that boron was used as the dopant. By using a boron-doped silicon substrate sliced from the manufactured FZ silicon single crystal, a solar cell was fabricated by the manufacturing method described by using FIG. 5.

The battery characteristics (short-circuit current density, open circuit voltage, fill factor, and conversion efficiency) were measured on the fabricated solar cell. The results are shown in Table 1.

Comparative Example 4

A gallium-doped CZ silicon single crystal was manufactured by a CZ method. By using a gallium-doped silicon substrate sliced from the manufactured CZ silicon single crystal, the solar cell 10 of FIG. 2 was fabricated by the manufacturing method described by using FIG. 5.

The battery characteristics (short-circuit current density, open circuit voltage, fill factor, and conversion efficiency) were measured on the fabricated solar cell. The results are shown in Table 1.

compared to that of Comparative Example 3, in which the dopant was boron. In Example 1, where the silicon single crystal was manufactured by an FZ method using a CZ crystal as the raw material rod, the conversion efficiency was improved compared to that of Comparative Example 4, in which the silicon single crystal was manufactured by a CZ method. In Example 4, where additional gallium-doping was performed by using dopant gas, the conversion efficiency was improved much more, and the crystal had the desired resistivity in an improved ratio (yield) compared to those of Examples 1 to 3, in which additional gallium-doping by using dopant gas was not performed.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing an FZ silicon single crystal for a solar cell, comprising the steps of:
    pulling a CZ silicon single crystal doped with gallium by a Czochralski method; and
    float-zone processing a raw material rod, with the raw material rod being the CZ silicon single crystal, at 1.6 atmospheric pressure or more to manufacture the FZ silicon single crystal; wherein
    the FZ silicon single crystal is subjected to additional gallium-doping by using dopant gas in the float-zone processing, and

TABLE 1

| | Dopant | Manufacture of silicon single crystal | Pressure in float-zone processing | Additional doping using dopant gas | Short-circuit current density (mA/cm$^2$) | Open circuit voltage (mV) | Fill factor | Conversion efficiency (%) |
|---|---|---|---|---|---|---|---|---|
| Example 1 | Ga | FZ method using CZ crystal raw material rod | 1.6 atm | None | 39.1 | 630.8 | 0.773 | 19.07 |
| Example 2 | Ga | FZ method using CZ crystal raw material rod | 1.8 atm | None | 38.8 | 635.0 | 0.781 | 19.24 |
| Example 3 | Ga | FZ method using CZ crystal raw material rod | 2.0 atm | None | 38.4 | 639.5 | 0.785 | 19.28 |
| Example 4 | Ga | FZ method using CZ crystal raw material rod | 1.6 atm | Exist | 38.4 | 640.5 | 0.786 | 19.33 |
| Comparative Example 1 | Ga | FZ method using CZ crystal raw material rod | 1.2 atm | None | 39.9 | 621.0 | 0.744 | 18.43 |
| Comparative Example 2 | Ga | FZ method using CZ crystal raw material rod | 1.4 atm | None | 39.8 | 627.4 | 0.760 | 18.98 |
| Comparative Example 3 | B | FZ method using CZ crystal raw material rod | 1.6 atm | None | 38.0 | 630.4 | 0.785 | 18.80 |
| Comparative Example 4 | Ga | CZ method | — | — | 38.1 | 626.1 | 0.788 | 18.80 |

As can be seen from Table 1, the conversion efficiency was improved in Examples 1 to 4 with the pressure in each float-zone processing being 1.6 atmospheric pressure or more, compared to that of Comparative Examples 1 to 2, in which the pressure in each float-zone processing was less than 1.6 atmospheric pressure. In Example 1 using gallium as the dopant, the conversion efficiency was improved as the dopant gas, any of an organic gallium compound and a halogenated gallium compound is used.

2. The method for manufacturing an FZ silicon single crystal for a solar cell according to claim 1, wherein the additional gallium-doping is performed with a flow rate and/or a concentration of the dopant gas being changed in an axial direction in accordance with an axial distribution of a gallium concentration of the CZ silicon single crystal to equalize an axial distribution of a gallium concentration of the FZ silicon single crystal.

3. The method for manufacturing an FZ silicon single crystal for a solar cell according to claim 1, wherein the float-zone processing is performed in an atmosphere containing argon or helium.

4. The method for manufacturing an FZ silicon single crystal for a solar cell according to claim 2, wherein the float-zone processing is performed in an atmosphere containing argon or helium.

5. The method for manufacturing an FZ silicon single crystal for a solar cell according to claim 1, wherein the FZ silicon single crystal is manufactured to have a diameter of 150 mm or more.

6. The method for manufacturing an FZ silicon single crystal for a solar cell according to claim 2, wherein the FZ silicon single crystal is manufactured to have a diameter of 150 mm or more.

7. The method for manufacturing an FZ silicon single crystal for a solar cell according to claim 3, wherein the FZ silicon single crystal is manufactured to have a diameter of 150 mm or more.

8. The method for manufacturing an FZ silicon single crystal for a solar cell according to claim 4, wherein the FZ silicon single crystal is manufactured to have a diameter of 150 mm or more.

9. A solar cell, wherein the solar cell is fabricated by using the FZ silicon single crystal manufactured by the method for manufacturing an FZ silicon single crystal for a solar cell according to claim 1.

* * * * *